US010018687B2

(12) United States Patent
Schaffer et al.

(10) Patent No.: US 10,018,687 B2
(45) Date of Patent: *Jul. 10, 2018

(54) INTEGRATED FLUXGATE MAGNETIC SENSOR AND EXCITATION CIRCUITRY

(71) Applicant: TEXAS INSTRUMENTS INCORPORATED, Dallas, TX (US)

(72) Inventors: Viola Schaffer, Freising (DE); Martijn Fridus Snoeij, Erding (DE); Mikhail Valeryevich Ivanov, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/987,549

(22) Filed: Jan. 4, 2016

(65) Prior Publication Data

US 2016/0116550 A1    Apr. 28, 2016

Related U.S. Application Data

(63) Continuation of application No. 14/174,289, filed on Feb. 6, 2014, now Pat. No. 9,229,066.
(Continued)

(51) Int. Cl.
*G01N 27/72* (2006.01)
*G01R 33/00* (2006.01)
(Continued)

(52) U.S. Cl.
CPC ......... *G01R 33/04* (2013.01); *G01R 33/0023* (2013.01); *G01R 35/005* (2013.01);
(Continued)

(58) Field of Classification Search
CPC .. G01R 33/04; G01R 15/185; G01R 33/0206; G01R 35/005; G01R 15/20;
(Continued)

(56) References Cited

U.S. PATENT DOCUMENTS

| 3,571,700 A | 3/1971 | Paine et al. |
| 4,293,815 A * | 10/1981 | West .................... G01R 33/045 324/254 |

(Continued)

FOREIGN PATENT DOCUMENTS

| JP | H08 5380 A | 1/1996 |
| JP | 3399185 | 4/2003 |

(Continued)

OTHER PUBLICATIONS

Prosecution History from U.S. Appl. No. 14/174,289 dated Feb. 6, 2014 to Dec. 17, 2015, 104 pages.
(Continued)

*Primary Examiner* — Huy Q Phan
*Assistant Examiner* — Raul Rios Russo
(74) *Attorney, Agent, or Firm* — John R. Pessetto; Charles A. Brill; Frank D. Cimino (57) ABSTRACT

Improved magnetic sensor excitation circuitry is presented for providing a periodic bidirectional excitation waveform to a fluxgate magnetic sensor excitation coil using a bridge circuit connected to the excitation coil and having lower transistors for switched selective connection to a current mirror input transistor to mirror a current provided by pulsed current source, and with integrated filtering to control pulse rise times and slew rate.

16 Claims, 5 Drawing Sheets

Related U.S. Application Data (60) Provisional application No. 61/866,454, filed on Aug. 15, 2013.

(51) Int. Cl.

| | | |
|---|---|---|
| *G01R 33/04* | (2006.01) | |
| *G01R 35/00* | (2006.01) | |
| G01R 33/02 | (2006.01) | |
| G01R 15/20 | (2006.01) | |
| G01K 7/10 | (2006.01) | |
| G01J 5/16 | (2006.01) | |
| G01L 19/00 | (2006.01) | |

(52) U.S. Cl.
CPC ............... *G01J 5/16* (2013.01); *G01K 7/10* (2013.01); *G01L 19/0092* (2013.01); *G01R 15/20* (2013.01); *G01R 33/02* (2013.01)

(58) Field of Classification Search
CPC ............ G01R 33/0041; G01R 33/02; G01R 33/0283; G01R 33/0356; G01R 1/44; G01R 11/18; G01R 11/185; G01R 11/19; G01R 19/32; G01R 21/14; G01R 33/0082; G01B 7/14; G01B 7/24; G01D 5/2013; G01N 27/72; G01J 5/16; G01K 7/10; G01L 19/0092
USPC .......... 324/253, 225, 251, 236, 237, 207.26, 324/249, 244, 117 R, 117 H, 228, 255, 324/260, 262; 73/763, 769, 86.331, 73/862.335, 862.69
See application file for complete search history.

(56) References Cited

U.S. PATENT DOCUMENTS

| | | | |
|---|---|---|---|
| 4,646,015 A | 2/1987 | Phillips | |
| 4,914,381 A | 4/1990 | Narod | |
| 5,689,445 A | 11/1997 | Vogt et al. | |
| 5,767,672 A * | 6/1998 | Guichard | G01V 3/101 |
| | | | 324/207.26 |
| 6,072,676 A * | 6/2000 | Tran | H03F 1/523 |
| | | | 323/284 |
| 6,201,391 B1 | 3/2001 | Burkhardt et al. | |
| 6,278,272 B1 | 8/2001 | Scarzello et al. | |
| 6,429,651 B1 | 8/2002 | Choi et al. | |
| 6,772,078 B2 | 8/2004 | Uehira | |
| 6,912,476 B2 | 6/2005 | Huber-Lenk et al. | |
| 7,034,586 B2 | 4/2006 | Mehas et al. | |
| 7,038,514 B2 | 5/2006 | Leith et al. | |
| 7,135,841 B1 | 11/2006 | Tomiyoshi et al. | |
| 7,298,141 B2 | 11/2007 | Bartington | |
| 7,375,940 B1 | 5/2008 | Bertrand | |
| 7,391,210 B2 | 6/2008 | Zhang et al. | |
| 7,391,211 B2 | 6/2008 | Cripe | |
| 7,400,120 B2 | 7/2008 | Hashimoto et al. | |
| 8,339,133 B2 | 12/2012 | Teppan | |
| 8,976,549 B2 | 3/2015 | Genannt Berghegger | |
| 9,030,248 B2 | 5/2015 | Kim et al. | |
| 9,300,212 B2 | 3/2016 | Notman et al. | |
| 2001/0012988 A1 | 8/2001 | Motz | |
| 2002/0097042 A1 | 7/2002 | Kawate et al. | |
| 2002/0180434 A1 | 12/2002 | How et al. | |
| 2003/0173922 A1* | 9/2003 | Pelonis | H02M 1/38 |
| | | | 318/400.29 |
| 2003/0178993 A1 | 9/2003 | Tang et al. | |
| 2003/0197554 A1* | 10/2003 | Sim | H02M 3/07 |
| | | | 327/589 |
| 2004/0040391 A1* | 3/2004 | May | G01D 5/14 |
| | | | 73/862.331 |
| 2004/0124836 A1 | 7/2004 | Kang et al. | |
| 2005/0024050 A1 | 2/2005 | Na et al. | |
| 2006/0033481 A1 | 2/2006 | Thiele et al. | |
| 2007/0103152 A1 | 5/2007 | Cripe | |
| 2007/0203666 A1 | 8/2007 | Watanabe et al. | |
| 2007/0247141 A1 | 10/2007 | Pastre et al. | |
| 2008/0048738 A1* | 2/2008 | Singnurkar | G05F 1/561 |
| | | | 327/132 |
| 2008/0084720 A1 | 4/2008 | Thiele et al. | |
| 2008/0291068 A1* | 11/2008 | Lee | H03M 1/0612 |
| | | | 341/135 |
| 2009/0096510 A1 | 4/2009 | Ogiwara et al. | |
| 2010/0026392 A1* | 2/2010 | Wong | H03F 1/523 |
| | | | 330/298 |
| 2011/0057592 A1* | 3/2011 | Sicard | H03K 17/08122 |
| | | | 318/400.26 |
| 2011/0148381 A1 | 6/2011 | Kwan et al. | |
| 2011/0227419 A1* | 9/2011 | Sato | H03H 7/0115 |
| | | | 307/104 |
| 2011/0245708 A1* | 10/2011 | Finkel | A61B 5/0484 |
| | | | 600/544 |
| 2012/0116715 A1 | 5/2012 | Yoshitake et al. | |
| 2012/0126799 A1 | 5/2012 | Schatz et al. | |
| 2013/0069613 A1 | 3/2013 | Nakase et al. | |
| 2013/0099334 A1 | 4/2013 | Mohan et al. | |
| 2013/0300383 A1 | 11/2013 | Bayer | |
| 2013/0300394 A1* | 11/2013 | Wang | H02M 3/158 |
| | | | 323/311 |
| 2013/0313993 A1* | 11/2013 | Wang | H03K 5/12 |
| | | | 315/240 |
| 2014/0139029 A1* | 5/2014 | Gasparini | G06F 1/26 |
| | | | 307/80 |
| 2015/0040682 A1* | 2/2015 | Momose | G01F 1/60 |
| | | | 73/861.12 |

FOREIGN PATENT DOCUMENTS

| | | |
|---|---|---|
| JP | 3399185 B2 | 4/2003 |
| SU | 832502 | 5/1981 |

OTHER PUBLICATIONS

Bazzocchi, et al. "Interference rejection algorithm for current measurement using magnetic sensor arrays", Sensors and Actuators 85 (2000), pp. 38-41.

Dezuari, et al. "Printed circuit board integrated fluxgate sensor", Sensors and Actuators 81 (2000), pp. 200-203.

Tang, et al. "Excitation circuit for fluxgate sensor using saturable inductor", Sensors and Actuators A 113 (2004), pp. 156-165.

Ripka, et al. "Pulse Excitation of Micro-Fluxgate Sensors", IEEE Transactions on Magnetics, vol. 37, No. 4, Jul. 2001 pp. 1998-2000.

Orljaca, et al., "Low-Power 2-D Fully Integrated CMOS Fluxgate Magnetometer", IEEE Sensors Journal, vol. 5, No. 5, Oct. 2005, pp. 909-915.

Choi et al., "The Microfluxgate Magnetic Sensor Having Closed Magnetic Path", IEEE Sensors Journal, vol. 4, No. 6, Dec. 2004, pp. 768-771.

International Search Report and Written Opinion of the International Searching Authority, PCT/US2014/051350, dated Feb. 27, 2015 (7 pages).

Chinese Search Report in corresponding Chinese Patent Application No. 201480042378.6, dated Jan. 23, 2018 (2 pages).

European Supplementary Search Report in corresponding European Patent Application No. 14836324.5, dated Jul. 5, 2017 (3 pages).

* cited by examiner

INTEGRATED FLUXGATE MAGNETIC SENSOR AND EXCITATION CIRCUITRY

This application is a continuation of U.S. patent application Ser. No. 14/174,289, filed Feb. 6, 2014, which claims priority to and the benefit of U.S. Provisional Patent Application Ser. No. 61/866,454, filed Aug. 15, 2013, the entirety of both applications being incorporated by reference herein.

FIELD OF THE INVENTION

The present disclosure relates to magnetic sensors and more particularly to improved excitation circuitry for providing excitation waveforms to an excitation coil of a fluxgate magnetic sensor.

BACKGROUND

Magnetic sensors are used in a variety of applications, such as for contactless current sensing, magnetometer applications, non-contact position sensing applications, etc. Fluxgate sensors are high sensitivity magnetic field sensors operated by driving an excitation winding or coil and sensing an output voltage from a sense winding or coil that is proportional to an external field. The excitation of the fluxgate sensor provides positive and negative alternating current, and many conventional excitation schemes provide sinusoidal excitation waveforms at a single fundamental frequency, which advantageously provides predictable harmonic content. However, sinusoidal excitation is inefficient with respect to power consumption, and sinusoidal excitation circuitry is costly and difficult to implement in integrated sensors. Conventional narrow pulse-mode voltage excitation circuits are comparatively more efficient since the excitation pulse only needs to be applied for a short amount of time in order to saturate the sensor and are fairly simple to implement. However, the amount of excitation current provided by the voltage pulse is dependent upon the supply voltage and the impedance of the excited sensor coil. Accordingly, a need remains for improved sensor excitation techniques and integrated fluxgate magnetic sensor excitation circuitry.

SUMMARY

The present disclosure provides magnetic sensors and excitation circuitry therefor in which an excitation coil or winding is driven using pulsed current, thereby facilitating low-power consumption and independence from power supply voltage and sensor impedance changes, by which the above and other shortcomings of conventional excitation circuits can be mitigated or overcome.

In accordance with various aspects of the disclosure, an excitation circuit is provided for excitation of a magnetic sensor. The excitation circuit includes a first transistor coupled between a power supply node and one end of the sensor excitation coil, as well as a second transistor coupled between the power supply node and the other end of the excitation coil. The excitation circuit further includes a pulsed current source alternately providing a first level of current and a second higher level of current, as well as a current mirror circuit with an input transistor coupled with the pulsed current source, and third and fourth transistors individually coupled between one end of the excitation coil ends and a circuit ground. A control circuit is provided which alternately couples one of the third and fourth transistors with the input transistor to mirror the second level of current from the pulsed current source to provide a periodic bidirectional excitation current waveform to the excitation coil.

In certain embodiments, the control circuit turns the first and second transistors on and the third and fourth transistors off when the pulsed current source is providing the first level of current, and then turns the first transistor on, turns the second transistor off, and couples the input transistor control terminal with the control terminal of the fourth transistor when the pulsed current source is providing the second higher level of current so as to form a first current mirror to conduct excitation current of a first polarity through the excitation coil. The control circuit then turns the first and second transistors on and the third and fourth transistors off when the pulsed current source is again providing the first level of current. Thereafter, the control circuit turns the second transistor on, turns the first transistor off, and couples the control terminal of the input transistor with a control terminal of the third transistor when the pulsed current source is again providing the second level of current to form a second current mirror to conduct excitation current of the opposite polarity through the excitation coil, and the control circuit repeats the process to provide a periodic bidirectional excitation current waveform to the excitation coil.

In certain embodiments, the control circuit operates the pulsed current source to alternately provide the first and second levels of current, and may also synchronize operation of a sense circuit with the excitation circuit in various embodiments. Certain embodiments of the excitation circuit also include an integrated filter circuit to control rise times of the excitation current waveform provided to the excitation coil, and certain implementations of the integrated filter circuit include a resistance coupled between the input transistor control terminal and the control terminals of the third and fourth transistors. In various embodiments, the excitation circuit includes a first switch coupled between the input transistor control terminal and the control terminal of the third transistor, as well as a second switch coupled between the input transistor control terminal and the control terminal of the fourth transistor, where the control circuit selectively operates the first and second switches to alternately couple one of the third and fourth transistors with the input transistor to mirror the second level of current from the pulsed current source to provide the periodic bidirectional excitation current waveform to the excitation coil. In various embodiments, moreover, the first and second transistors, the pulsed current source, the current mirror circuit and the control circuit are implemented on or in a single integrated circuit.

A magnetic sensing apparatus is provided in accordance with further aspects of the disclosure, which includes a fluxgate sensor structure with an excitation coil and a sense coil, a sense circuit, and an excitation circuit including first and second transistors, a pulsed current source, a current mirror circuit and a control circuit, and a sense circuit. The first transistor of the excitation circuit is coupled between a power supply node and one end of the excitation coil, and the second transistor is coupled between the supply node and the other end of the excitation coil. The excitation circuit further includes a pulsed current source alternately providing a first level of current and a second higher level of current, as well as a current mirror circuit with an input transistor coupled with the pulsed current source, and third and fourth transistors individually coupled between one of the excitation coil ends and a circuit ground. In addition, control circuit is provided which alternately couples one of the third and fourth transistors with the input transistor to mirror the second level of current from the pulsed current source to provide a periodic bidirectional excitation current waveform to the excitation coil.

In accordance with one or more aspects of the disclosure, an excitation circuit is provided for driving a magnetic sensor excitation coil. The excitation circuit includes a pulsed current source and a bridge circuit with first and second branches individually including upper and lower transistors coupled between a supply node and a circuit ground and joined to one another at a corresponding internal node, with the corresponding internal nodes each individually connected to a corresponding end of the magnetic sensor excitation coil. The excitation circuit also includes a switched current mirror circuit with an input transistor connected between the second terminal of the pulsed current source and the circuit ground, along with first and second switches individually coupled between the control terminal of the input transistor and the control terminal of a corresponding lower transistor of the bridge circuit branches. The excitation circuit further includes a control circuit operative to selectively operate the first and second switches to alternately couple one of the lower transistors with the input transistor to mirror the second level of current from the pulsed current source to provide a periodic bidirectional excitation current waveform through the bridge circuit to the excitation coil. Certain embodiments include an integrated filter circuit to control rise times of the excitation current waveform provided to the excitation coil, such as a resistance coupled between the input transistor control terminal and a node joining the first and second switches.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

One or more embodiments or implementations are hereinafter described in conjunction with the drawings, wherein like reference numerals are used to refer to like elements throughout, and wherein the various features are not necessarily drawn to scale. The present disclosure provides a pulsed current source excitation circuit with a switched current mirror circuit to provide a bidirectional periodic excitation current waveform to a magnetic sensor excitation coil. The exemplary excitation circuitry is illustrated in connection with exemplary fluxgate sensor configurations, although the various concepts of the present disclosure may be employed to provide excitation waveforms to other forms of magnetic sensors.

Figure 1:
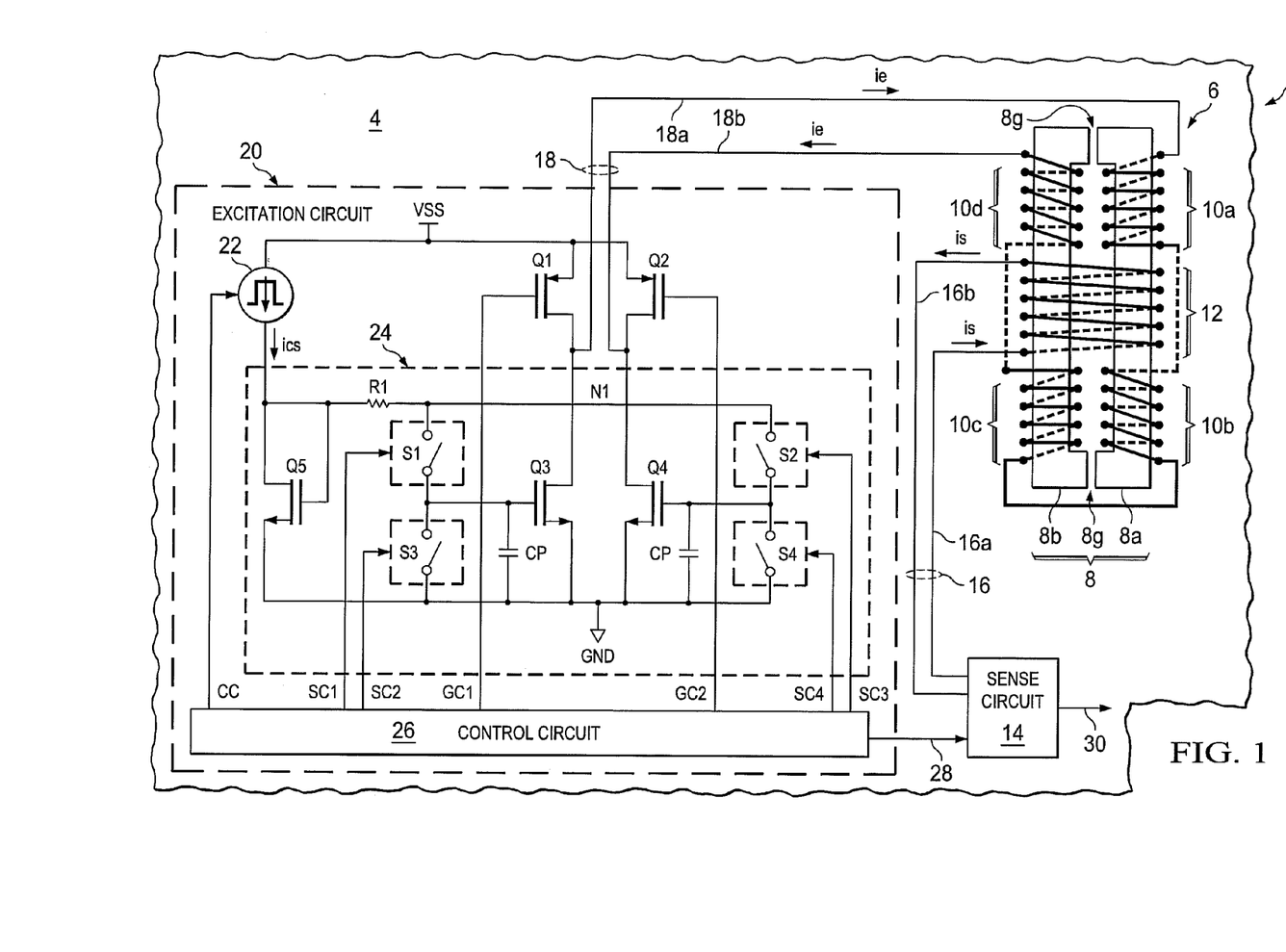
FIG. 1 is a partial schematic top plan view illustrating an exemplary fluxgate magnetic sensor formed on or in a substrate of an integrated circuit and an associated excitation circuit with a pulsed current source and switched current mirror circuitry in accordance with one or more aspects of the present disclosure.

FIG. 1 illustrates an exemplary fluxgate magnetometer apparatus 2 formed on and/or in a semiconductor substrate 4, including a fluxgate magnetic sensor 6, an excitation circuit 20 and a sense circuit 14. The fluxgate sensor 6 includes a magnetically susceptible core structure 8, such as may be formed on and/or in the substrate 4, with an excitation winding or coil 10 including excitation coil sections 10a, 10b, 10c and 10d wound around portions of the core 8, and a centrally located sense winding 12. In the illustrated example, the windings 10 and 12 are formed around corresponding portions of the core structure 8 using conductive portions on different layers of the substrate assembly 4, with solid lines showing winding portions above the corresponding core structure 8 and dashed-lines showing winding portions below the corresponding core structure 8 in the illustrated view. Any number of excitation and sense windings 10, 12 may be used in different embodiments. In this example, moreover, the magnetically susceptible core structure 8 includes two longitudinally opposite gaps 8g separating bilaterally symmetrical core portions 8a and 8b. Other designs are possible in which no gap 8g is used, or a single gap may be provided, or more than two such gaps 8g may be included in the core structure 8. Furthermore, the core portions 8a and 8b may, but need not be symmetrical in all embodiments of the present disclosure. In addition, the coil windings in different embodiments can take on many different variations, which in general should not impact the excitation circuitry aspects of the present disclosure, and additional coils can be included on the fluxgate sensor without impact on the excitation circuitry.

The excitation circuit 20 provides an AC excitation signal 18 to the excitation windings 10 via connections 18a and 18b to the respective first and second ends of the excitation coil 10. The sensing circuitry 14 receives a sensor coil signal 16 via connections 16a and 16b to ends of the sense coil 12, and provides at least one output signal or value 30, such as a voltage signal in one example, based at least partially on the sensor signals 16 received from the sense winding 12. In one non-limiting form of operation, the excitation circuit 20 provides alternating excitation current waveforms "ie" to the excitation windings 10 to alternately drive the core structure 8 through magnetic saturation and demagnetization in opposite polarities or directions, thereby inducing an electrical sense current flow "is" in the sensing coil 12. The illustrated fluxgate sensor 6 is configured for sensing an external magnetic field generally in the vertical direction in FIG. 1, with the sense circuit 14 including suitable demodulation circuitry to provide the output signal or value 30 representing the magnitude of the external magnetic field proximate the sensor 6. Specifically, when the core structure 8 is exposed to an external magnetic field (e.g., vertically upward in the orientation shown in FIG. 1), the core structure 8 is more easily saturated in alignment with that field, and less easily saturated in opposition to the external field. Consequently, the induced sense coil current "is" will be out of phase with the excitation current, and the difference will be related to the strength of the external magnetic field. In one possible implementation, the sensing (interface) circuit 14 includes an integrator circuit providing an analog output voltage signal 30 proportional to the sensed magnetic field along the corresponding sensing direction of the fluxgate magnetic sensor 6. Moreover, the sense circuit 14 in certain embodiments is synchronized with the operation of the excitation circuit 20 by one or more control signals 28 from a control circuit 26 of the excitation circuit 20.

As seen in FIG. 1, the excitation circuit 20 includes a pulsed current source 22 with an upper or first terminal connected to a first power supply voltage node VSS, where the current source 22 is operated by a current control signal CC from the control circuit 26 to alternately provide a first low level of current (which can be zero) and a second higher level of current from a second or lower terminal in the downward direction in the figure. Other embodiments are possible in which the pulsed current source 22 provides two different levels of current in alternating fashion, with a corresponding duty cycle that may but need not be 50%. The pulsed current source 22, moreover, can be any suitable circuitry by which a reliable, repeatable current waveform is provided, for example, using suitable bipolar and/or MOS transistors. In addition, certain embodiments of the pulsed current source 22 are operable largely independent of fluctuations in the supply voltage provided at the first supply node VSS.

In addition, the excitation circuit 20 includes a bridge circuit formed by transistors Q1-Q4 including upper first and second transistors Q1 and Q2, which are PMOS devices in the illustrated non-limiting example, operated by corresponding gate control signals GC1 and GC2 from the control circuit 26. In this embodiment, the control signals GC1 and GC2 are provided by the control circuit 26 at a low voltage level (e.g., at or near the voltage of a second power supply node, in this case a circuit ground node GND shown in FIG. 1) to turn the corresponding transistors Q1 and Q2 on, and the control signals GC1 and GC2 are provided in a higher level, such as at or near the supply voltage level VSS to turn the transistors Q1 and Q2 off.

The bridge circuit further provides first and second branches (e.g., left and right vertical branch circuits in FIG. 1), where the individual branches include series-connected upper and lower transistors coupled between the power supply node VSS and the circuit ground GND. As seen in FIG. 1, for example, the first branch of the excitation circuit 20 includes the first transistor Q1 and a lower NMOS transistor Q3 connected between VSS and GND, and joined to one another at a node connected to the first end of the sensor excitation coil 10 via the connection 18a. Similarly, the second branch circuit includes the PMOS transistor Q2 connected in series with a corresponding lower NMOS transistor Q4, with the drains of Q2 and Q4 being connected to one another and to the second end of the excitation coil 10 via connection 18b. It is noted that the exemplary embodiment of FIG. 1 provides a circuit with a switchable NMOS current mirror including Q3-Q5 and PMOS upper bridge transistors Q1 and Q2, with the first power supply node VSS being at a positive voltage relative to the second power supply node GND. Other embodiments are possible, such as the exemplary apparatus 2a in FIG. 5 below, in which the first power supply node is a circuit ground (GND) and the second power supply node is a positive voltage node (VSS), with the input transistor (Q5) and the third and fourth transistors Q3 and Q4 of the current mirror 24 being PMOS devices, and with the first and second transistors Q1 and Q2 being NMOS devices.

The excitation circuit example 20 in FIG. 1 further provides a switched current mirror circuit 24 including an input transistor Q5, in this case an NMOS device, with a drain connected to the second or lower terminal of the pulsed current source 22 and a source connected to the circuit ground GND as shown. Q5 operates as an input transistor of a switchable NMOS current mirror configuration using the lower bridge circuit NMOS transistors Q3 and Q4 for selectively mirroring the current provided by the pulsed current source 22. By this selective mirroring, the excitation circuit 20 is operable to provide bidirectional excitation current pulse waveforms to the excitation coil 10 by provision of switching control signals SC1-SC4 from the control circuit 26 in conjunction with the operation of the upper bridge circuit transistors Q1 and Q2 via respective gate control signals GC1 and GC2. Although illustrated as a switched NMOS current mirror circuit 24, bipolar and other current mirror configurations can be used in other embodiments. In the illustrated example, the current mirror circuit 24 includes switches S1-S4 configured to selectively connect the gate control terminals of the lower transistors Q3 and Q4 to either the circuit ground GND or an internal node N1 which is coupled through a resistor R1 to the gate control terminal of the current mirror input transistor Q5, with the control circuit 26 providing corresponding the switching control signals SC1-SC4. Any suitable types and forms of switches S1-S4 can be used by which the control terminals (e.g., gates) of Q3 and Q4 can be controlled so as to selectively turn the devices Q3 and Q4 on and off individually, and to selectively couple the control terminals of Q3 and Q4 with the control terminal of Q5 in a selective manner.

In the illustrated example, switch S1 can be closed by the control circuit 26 providing a corresponding switching control signal SC1 to electrically couple the gate of Q3 to an intermediate node N1 and in this case through an optional resistor R1, to the gate control terminal of Q5. The switch S2 similarly provides controllable coupling of the gate of Q4 to the node N1 and thus to the gate of Q5, through the resistance R1 in the illustrated example. Switches S3 and S4 are connected from the gates of Q3 and Q4 to the circuit ground GND and operated by switching control signals SC3 and SC4 from the control circuit 26, respectively, to selectively connect the corresponding gate control terminal to the circuit ground GND, thereby turning off the corresponding transistor Q3, Q4. In addition, certain embodiments of the control circuit 26 provide one or more control signals 28 to synchronize operation of the excitation current 20 with operation of the sense circuit 14.

By this configuration, a low-power pulse excitation circuit 20 is provided, with the pulsed current source 22 and current mirroring circuitry 24 providing controlled excitation current pulses whose magnitude and timing is controlled largely or wholly independent of fluctuations in the power supply voltage VSS and the electromagnetic characteristics of a given fluxgate sensor 6 to which the circuit 20 is connected. The illustrated excitation circuit 20 is operated in different modes by the control circuit 26 to initially connect the ends of the excitation coil 10 together at the power supply voltage VSS and to maintain this condition for sufficient time to ensure that the current flowing in the inductive excitation coil 10 is reduced substantially or completely to zero, and thereafter turns on one of the upper bridge transistors Q1 or Q2 along with the lower transistor of the opposite bridge circuit branch (Q4 or Q3) thereby coupling the selected lower transistor to mirror current via Q5 at a level set by (e.g., proportional to or equal to) the higher or second current level provided by the pulsed current source 22. The control circuit 26 thereafter repeats the process by connecting both ends of the excitation coil 10 to the power supply voltage VSS via Q1 and Q2 and subsequently turning on the other one of the upper transistors Q1 and Q2 and the lower transistor of the opposite branch Q4 or Q3 to provide mirrored current to the excitation coil 10 in the opposite direction, and this process is repeated in a periodic fashion by the control circuit 26. By this operation, therefore, the excitation circuit 20 provides a periodic bidirectional excitation current waveform through the bridge circuit Q1-Q4 to the excitation coil 10 with the corresponding current pulses of alternating polarity being substantially similar to one another in magnitude and duration in certain embodiments, and being largely independent of the supply voltage VSS and the characteristics of the connected excitation coil 10 and sensor 6.

In addition, the resistance of an included resistor R1 in combination with the parasitic gate-source capacitances CP of the lower bridge transistors Q3 and Q4 provides an RC filter circuit integrated into the excitation circuit 20, with the value of the resistance R1 and the capacitance CP controlling rise times in the provided excitation current waveform conducted through the bridge circuit and the excitation coil 10. In other embodiments, the resistance R1 can be omitted. In other embodiments, an additional capacitor component can be provided, which together with any parasitic capacitance CP and the resistance R1, provides a desired RC time constant for the integrated filter circuit. In embodiments employing the resistor R1, the resulting RC circuit R1, CP provides a low pass filter to control the increase in the current output by the second (lower) terminal of the pulsed current source 22 in transitioning from the first lower level to the second higher current level. Because this current is selectively mirrored by the selected one of the lower bridge circuit transistors Q3 and Q4 when the corresponding switch S1 or S2 is closed by the control circuit 26, the RC circuit R1, CP operates to control the rise time of the current pulse provided through the bridge circuit to the magnetic sensor excitation coil 10.

In addition, the provision of the filtering provided by R1, CP can be tailored in specific implementations to control overshoot in the sensor output signal current 16, thereby facilitating demodulation by the sense circuit 14. In the illustrated example, the dimensions and operating parameters of the mirroring transistors Q3 and Q4 are preferably matched to one another such that the corresponding parasitic capacitances CP and the resulting filtering is substantially the same for both positive and negative current pulses. In addition, matching of the transistors Q3 and Q4 in certain embodiments facilitates the provision of mirrored current pulses to the excitation coil 10 in opposite directions of substantially the same waveform, amplitude, duration, etc. (although of opposite polarity). However, precise matching of Q3 and Q4 is not a strict requirement of the present disclosure, and specific embodiments may be designed such that a desired difference between the positive and negative current pulses is achieved by controlling the design differences between the mirrored currents conducted through the selected one of Q3 and Q4, for example, by making Q3 and Q4 slightly different from one another, by changing the timing of the positive and negative excitation half cycles by the control circuit 26, etc.

Figure 2:
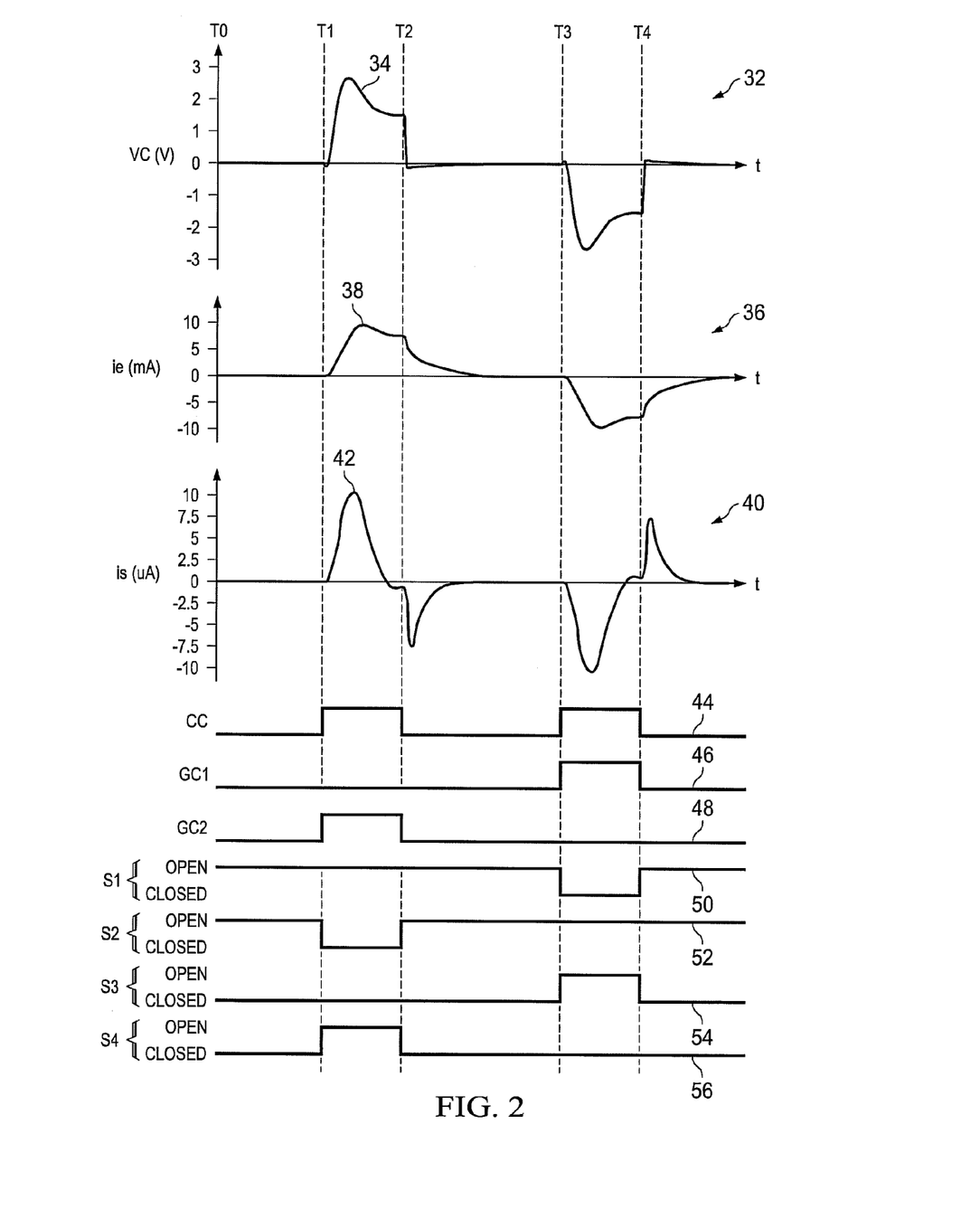
FIG. 2 illustrates a graph showing waveform diagrams for operation of the excitation circuit of FIG. 1.
Figure 3:
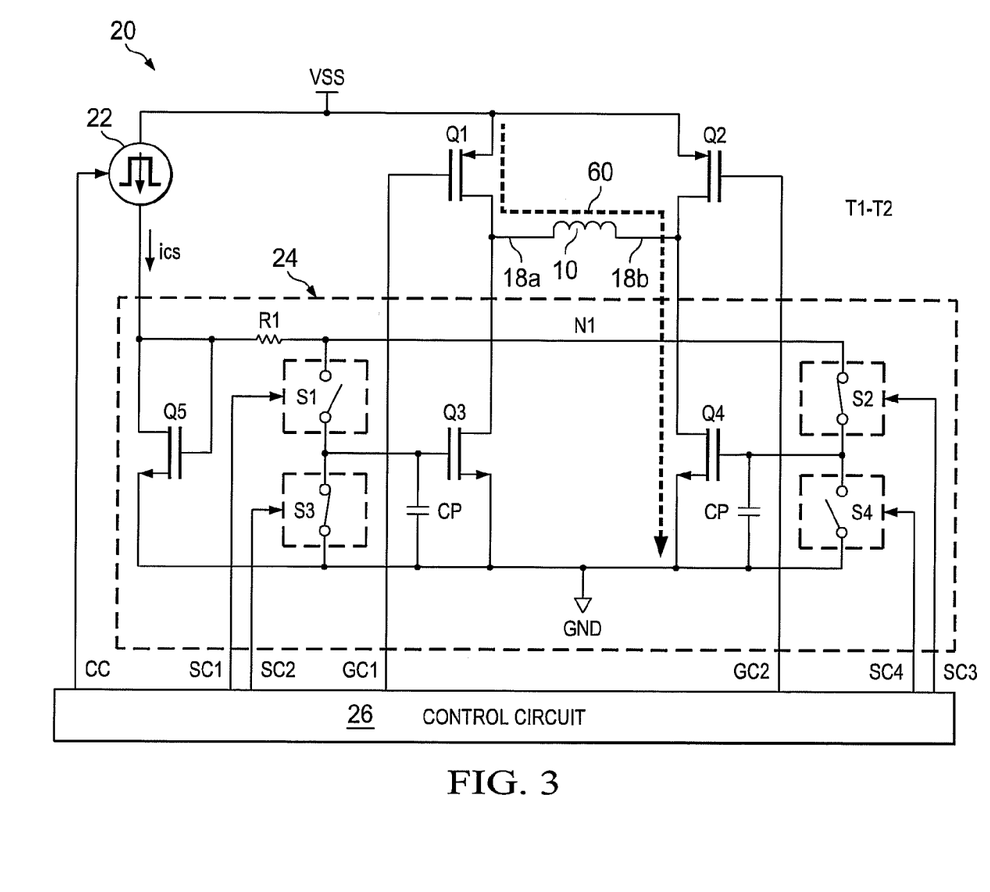
FIG. 3 is a schematic diagram illustrating the excitation circuit of FIG. 1 with the switched current mirror circuit operated to mirror current from the pulsed current source using one selected lower bridge circuit transistor to conduct current through the excitation coil in a first direction.
Figure 4:
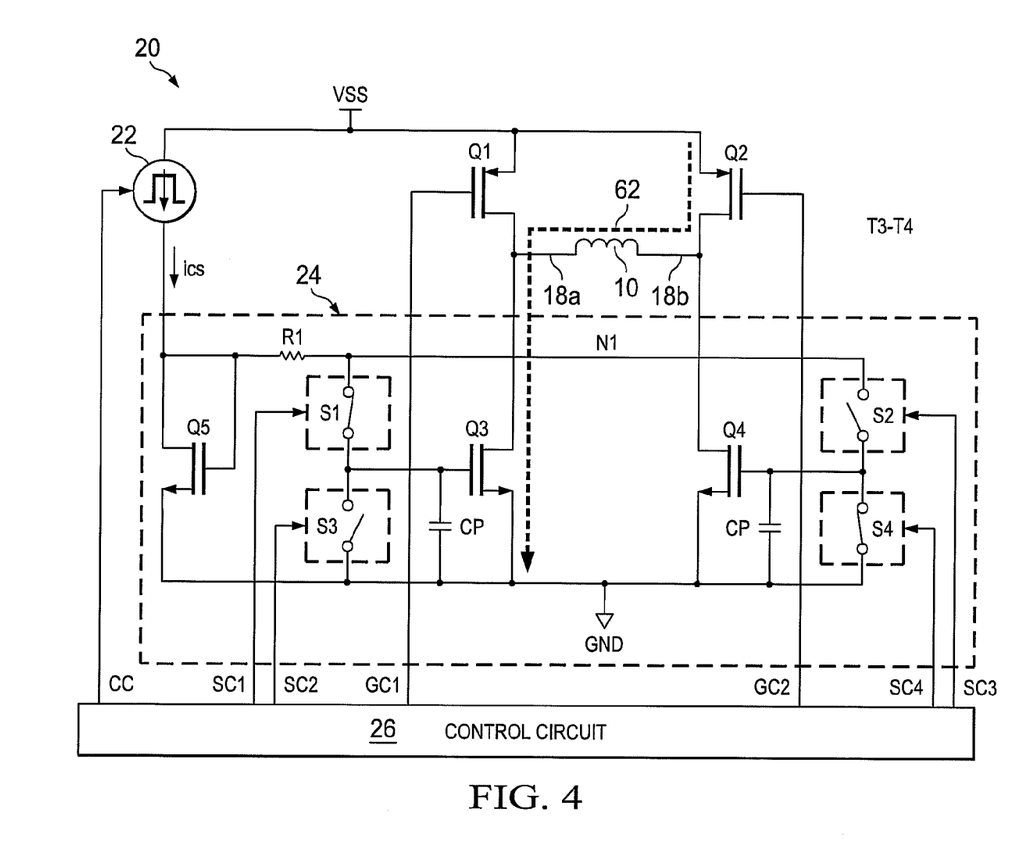
FIG. 4 is a schematic diagram illustrating the excitation circuit with the switched current mirror circuit operated to mirror current from the pulsed current source using the other lower bridge circuit transistor to conduct current through the excitation coil in a second opposite direction.

Referring also to FIGS. 2-4, FIG. 2 illustrates graphs 32, 36, 40, 44, 46, 48, 50, 52, 54 and 56 showing one non-limiting example of signals and waveforms provided by the excitation circuit 20 in operation. In addition, FIGS. 3 and 4 illustrate current flow direction through the bridge circuitry of the excitation circuit 20 during alternating pulsing portions of an operational cycle of the excitation circuit 20. The graph 32 in FIG. 2 illustrates a coil voltage waveform 34 (VC) as a function of time during one cycle of the excitation circuit 20. The graph 36 illustrates corresponding excitation coil current waveforms 38 and the graph 40 shows a corresponding sense coil output signal waveform 42. The graphs 44, 46 and 48 respectively illustrate control signals CC, GC1 and GC2 provided by the illustrated control circuit 26 for operating the pulsed current source 22 and the upper bridge transistors Q1 and Q2, respectively. Moreover, the graphs 50, 52, 54 and 56 illustrate the operating state of switches S1-S4 in the switched current mirror circuit 24 (OPEN or CLOSED) resulting from selective actuation of the switching control signals SC1-SC4 by the control circuit.

From time T0 until T1 in FIG. 2, the pulsed current source 22 provides a low level current output ("ics" downward in FIG. 1) to the current mirror input transistor Q5, where the first current level from T0 through T1 can be zero in certain embodiments, or can be some small value to mitigate complete discharging of various parasitic capacitances in the switched current mirror circuit 24. As mentioned, the timing of the provision of the first low current level and the second higher current level by the pulsed current source 22 can be separately controlled and synchronized with the switching operation of the control circuit 26, or the pulsed current source 22 may switch between output current levels according to the illustrated current control signal CC provided by the control circuit 26, as shown in the graph 44 of FIG. 2. During this time period from T0 through T1, moreover, the control circuit 26 turns the first and second transistors Q1 and Q2 on (e.g., by providing low gate control signals GC1 and GC2 in graphs 46 and 48) and turns Q3 and Q4 off by closing S3 and S4 while S1 and S2 are open via the control signals SC1-SC4 (graphs 50, 52, 54 and 56). The duration between T0 and T1 (and that between T2 and T3) in specific embodiments is set or controlled such that any previously flowing current through the excitation coil 10 of the magnetic sensor 6 is dissipated to or substantially to zero.

At T1 in FIG. 2, the control circuit 26 switches the pulsed current source 22 to provide the second higher level of current to Q5 (graph 44), turns (e.g., maintains) Q1 in the on state by maintaining the low gate control signal GC1 as shown in graph 46, and turns off Q2 by raising the gate control signal GC2 in graph 48. In this manner, the connection of the second end of the excitation coil 10 to the supply voltage VSS is discontinued. Also at T1, the control circuit 26 closes S2 and opens S4 (graphs 52 and 56), thereby connecting the gate of Q4 to the node N1, and thus to the gate of the current mirror input transistor Q5 via any included resistor R1, such that Q4 mirrors the second higher level of current provided by the pulsed current source 22. In addition, the control circuit 26 maintains S1 open and closes S3 at T1 (graphs 50 and 54) to turn off Q3. In this condition, therefore, the excitation coil voltage VC rises as shown in the waveform 34 of graph 32, and a positive excitation current "ie" flows through the bridge circuit transistors Q1 and Q4 from VSS through Q1, into the first end of the excitation coil 10 via connection 18*a* and out of the second end of the excitation coil 10 via connection 18*b*, and then through the selected mirroring transistor Q4 of the bridge circuit to the circuit ground GND, as shown in the dashed line 60 in FIG. 3. This results in an initial positive current pulse in the sensor coil output signal "is" (waveform 42 in graph 40), where the provision of the resistor R1 and the parasitic capacitance CP of the selected current mirror transistor Q4 operates to control the rise time (e.g., slope) of the positive current pulse waveform 38.

At time T2, while the pulse current source 22 is again providing the low first level of current, the control circuit 26 again turns on Q1 and Q2 to connect both ends of the excitation coil 10 to the supply voltage VSS, and turns off Q3 and Q4 by opening S1 and S2 while closing S3 and S4. The control circuit 26 may be designed to provide any desired duration between T1 and T2, for example, preferably adequate to provide sufficient excitation current to the coil 10 to drive the sensor core 8 into saturation in a first direction, although saturation in either the positive or the negative half cycles is not a strict requirement of the present disclosure. As seen in the graph 32, the coil voltage drops toward zero after T2, and may undershoot somewhat. Since the excitation coil 2 is somewhat inductive, the excitation current waveform 38 (graph 36) is steadily reduced, eventually reaching zero between T2 and T3. Furthermore, the change in direction of the excitation current waveform 38 from rising to falling results in a decrease in the sensor coil output signal waveform 42 (graph 40), which reverses direction and undergoes a downward trend following T2, after which the negative sensor output current level is reduced again to zero between T2 and T3. The control circuit 26 in various embodiments can be designed for any specific application to provide a time duration between T2 and T3 which is preferably sufficient to allow the excitation and sensor currents to reach or approximate zero before the reverse polarity excitation begins at T3. In addition, the provision of the integrated filter circuit via R1 and CP provides design control over the amount and duration of the overshoot and undershoot of the sensor current waveform 42 in graph 40.

At time T3 in FIG. 2, the control circuit 26 turns on (e.g., maintains) Q2 to connect the second end of the excitation coil 10 to the supply voltage VSS via the connection 18b, and turns off Q1. Moreover, the control circuit turns off Q4 by maintaining S4 in a closed position and maintaining S2 in the open position, and turns on Q3 by closing S1 and opening S3 so as to couple the gate of Q3 through R1 with the gate of Q5. In this configuration, Q3 mirrors the second higher level of current provided by the pulsed current source 22. Between T3 and T4, the excitation circuit 20 thus provides a negative or opposite polarity current pulse through the bridge circuit and the excitation coil 10, conducting from the supply voltage VSS through Q2, into the second end of the excitation coil 10 via connection 18b and out of the first end of the excitation coil 10 via connection 18a, and then through the selected current mirror transistor Q3 to the circuit ground GND as shown in the dashed line 62 in FIG. 4. As seen in the graphs 32, 36 and 40 of FIG. 2, this provides a negative voltage pulse VC across the excitation coil 10 (graph 32), and a negative excitation current pulse waveform 38, with the rise time being controlled by the resistor R1 and the parasitic capacitance CP of Q4. At T4, the control circuit 26 again turns Q1 and Q2 on to connect both ends of the excitation coil 10 to the supply voltage VSS, and turns Q3 and Q4 off by opening S1 and S2 while closing S3 and S4 with the excitation circuit 22 providing the low first level of current. This completes a single bidirectional excitation current waveform cycle by the excitation circuit 20, and the control circuit 26 repeats the cycle in periodic fashion.

The control circuit 26 in certain embodiments controls the timing between T1 and T2 to be substantially equal to that between T3 and T4, although not a strict requirement of all embodiments of the various concepts of present disclosure.

Moreover, the control circuit 26 may optionally provide a synchronizing control signal 28 to the sense circuit 14, which operates to demodulate the output signal 16 provided from the sense coil 12, for example, by rectifying and integrating the waveform 42 in graph 40 or by other suitable means to provide an output signal or value 30 representing the external magnetic field strength proximate the location of the fluxgate sensor 6 (e.g., in the vertical direction in FIG. 1).

Figure 5:
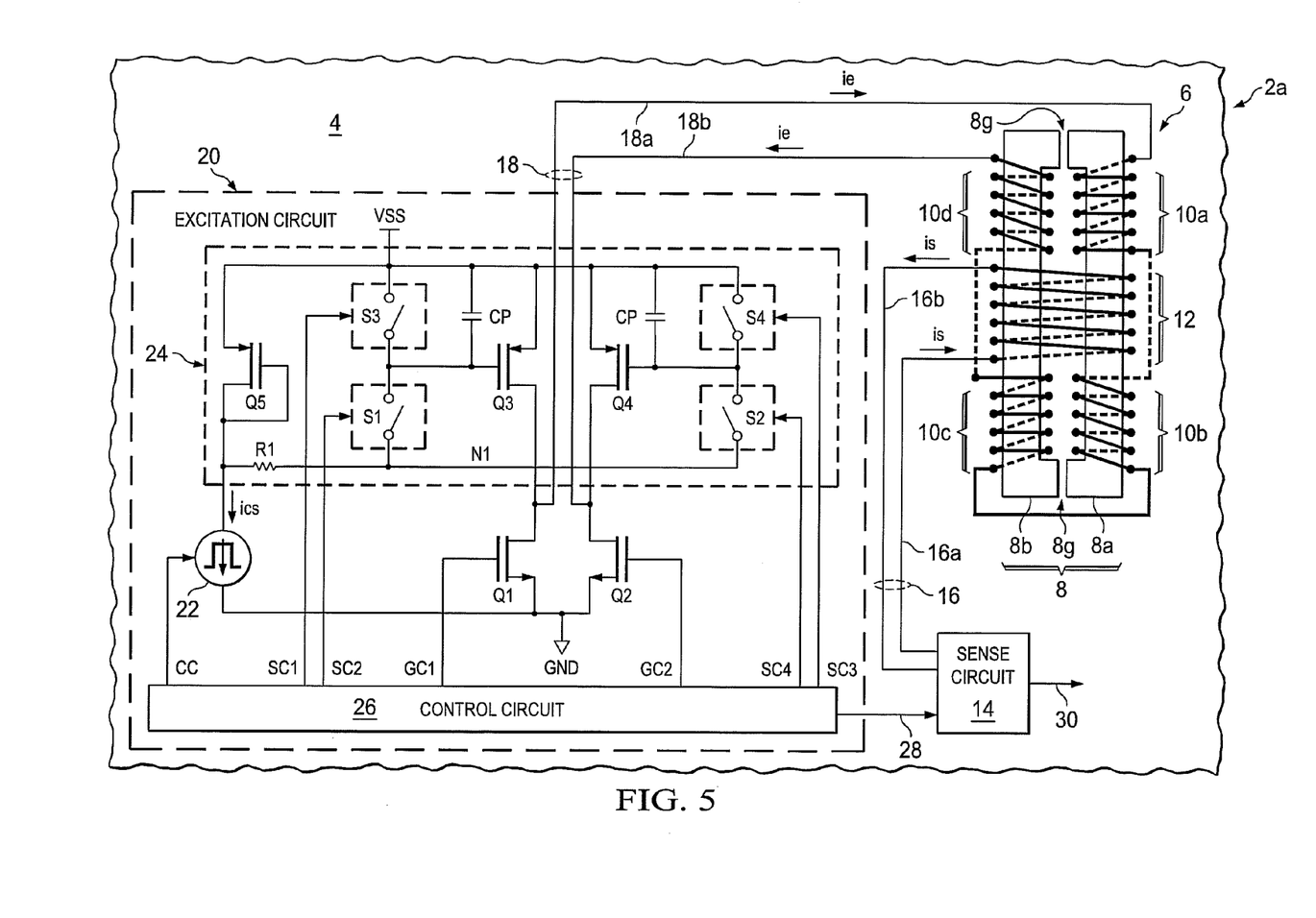
FIG. 5 is a partial schematic top plan view illustrating another exemplary excitation circuit with a pulsed current source and switched current mirror circuitry in accordance with the present disclosure.

FIG. 5 illustrates another non-limiting embodiment of a magnetometer apparatus 2a with an excitation circuit 20, where the bridge circuit includes NMOS transistors Q1 and Q2 operated according to the switching control signals GC1 and GC2 from the control circuit 26, which are connected between the respective excitation coil ends and a first power supply node, in this case a circuit ground GND, where a second power supply node VSS is at a positive voltage relative to the circuit ground. In this example, moreover, the input transistor Q5 and the selectable current mirror transistors Q3 and Q4 are PMOS transistors. This further embodiment operates in a similar complementary manner to the excitation circuit 20 described above in connection with FIG. 1, with the pulsed current source 22 providing a first level of current and a second higher level of current in the direction indicated in FIG. 5. T in FIG. 5 the switches S1-S4 are controlled by switching control signals SC1-SC4 to selectively couple the gate of one of Q3 and Q4 with the gate of the input transistor Q5 (through any included resistance R1) for selective mirroring of the second higher level of current to provide current pulses to the excitation coil 10 in alternating fashion as previously described, with the enabled current mirror transistor Q3 or Q4 operating as a current source to provide current through the excitation winding 10 which is then conducted from the other end of the excitation winding 10 through the corresponding selected one of the NMOS transistors Q1 and Q2.

The disclosed excitation circuitry 20 advantageously provides a small, easy to implement circuit design, thus representing a significant advance compared with sinusoidal excitation approaches. Moreover, in contrast to conventional voltage pulse excitation techniques, the pulsed current source, switched current mirror concepts of the present disclosure also facilitate simple compact design implementation while mitigating or overcoming supply voltage and sense coil characteristic dependence issues. Moreover, the optional synchronization with the sense circuitry 14 facilitates demodulation of the sense coil output without undue circuit complexity. In addition, the disclosed circuitry 20 advantageously employs selective mirroring of the output of a single pulsed current source 22 to facilitate provision of substantially similar or identical pulses of opposite polarity in alternating fashion for controlled excitation of the coil 10 to operate the fluxgate sensor 6. Furthermore, the design is easily adapted to provide a controlled integrated filter, for example, by providing the resistor R1 between the node N1 and the control gate of Q5, thus facilitating specific tailoring of the current pulse rise times, sensor output current overshoot, etc.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. An excitation circuit for driving an excitation coil of a fluxgate magnetic sensor, the excitation circuit comprising:
   a first transistor coupled between a first power supply node and the excitation circuit;
   a second transistor coupled between the first power supply node and the excitation circuit;
   a current source connected to the first power supply node;
   a current mirror circuit, including:
      an input transistor connected between the current source and a second power supply node,
      a third transistor connected between the excitation circuit and the second power supply node,
      a fourth transistor connected between the excitation circuit and the second power supply node,
      a first switch coupled between a control terminal of the input transistor and a control terminal of the third transistor, and
      a second switch coupled between the control terminal of the input transistor and a control terminal of the fourth transistor.

2. The excitation circuit of claim 1, further comprising a control circuit, wherein the control circuit is configured to:
   turn the first and second transistors on and turn the third and fourth transistors off when the current source is providing a first level of current;
   (ii) then turn the first transistor on, turn the second transistor off, and close the second switch when the current source is providing a second level of current to form a first current mirror;
   (iii) then turn the first and second transistors on and turn the third and fourth transistors off when the current source is again providing the first level of current;
   (iv) then turn the second transistor on, turn the first transistor off, and close the first switch when the current source is again providing the second level of current to form a second current mirror; and
   (v) repeat (i) through (iv) to provide a periodic bidirectional excitation current waveform.

3. The excitation circuit of claim 2, wherein the control circuit operates the current source to alternately provide the first and second levels of current.

4. The excitation circuit of claim 2, comprising an integrated filter circuit to control rise times of the excitation current waveform.

5. The excitation circuit of claim 4, wherein the integrated filter circuit includes a resistance coupled between the control terminal of the input transistor and the control terminals of the third and fourth transistors.

6. The excitation circuit of claim 2, wherein the second power supply node is a circuit ground, wherein the first power supply node is a positive voltage node, wherein the first and second transistors are PMOS (P-type metal-oxide-semiconductor) devices, and wherein the input transistor and the third and fourth transistors are NMOS (N-type metal-oxide-semiconductor) devices.

7. The excitation circuit of claim 2, wherein the first power supply node is a circuit ground, wherein the second power supply node is a positive voltage node, wherein the first and second transistors are NMOS devices, and wherein the input transistor and the third and fourth transistors are PMOS devices.

8. The excitation circuit of claim 2, further comprising wherein the control circuit is configured to selectively operate the first and second switches to alternately couple one of the third and fourth transistors with the input transistor to mirror a level of current from the current source to provide the periodic bidirectional excitation current waveform.

9. The excitation circuit of claim 1, comprising a resistance connected between the control terminal of the input transistor and a node joining the first and second switches.

10. The excitation circuit of claim 1, further comprising a control circuit configured to operate the current source to alternately provide first and second levels of current.

11. The excitation circuit of claim 1, further comprising an integrated filter circuit to control rise times of an excitation current waveform.

12. The excitation circuit of claim 11, wherein the integrated filter circuit includes a resistance coupled between the control terminal of the input transistor and the control terminals of the third and fourth transistors.

13. The excitation circuit of claim 1, further comprising a control circuit configured to selectively operate the first and second switches to alternately couple one of the third and fourth transistors with the input transistor to mirror the second level of current from the current source to provide a periodic bidirectional excitation current waveform.

14. The excitation circuit of claim 13, further comprising a resistance connected between the control terminal of the input transistor and a node joining the first and second switches.

15. The excitation circuit of claim 1, wherein the first and second transistors, the current source, the current mirror circuit and the control circuit are implemented on or in a single integrated circuit.

16. The excitation circuit of claim 10, wherein the first level of current provided by the current source is zero.

* * * * *